United States Patent [19]

Kotaki

[11] Patent Number: 4,977,099

[45] Date of Patent: Dec. 11, 1990

[54] METHOD FOR FABRICATING SEMICONDUCTOR MEMORY DEVICE

[75] Inventor: Hiroshi Kotaki, Tokyo, Japan

[73] Assignee: NEC Corporation, Tokyo, Japan

[21] Appl. No.: 430,691

[22] Filed: Oct. 31, 1989

[30] Foreign Application Priority Data

Oct. 31, 1988 [JP] Japan .................... 63-276482

[51] Int. Cl.$^5$ ........................... H01L 21/265
[52] U.S. Cl. ............................ 437/52; 437/40; 437/41; 437/44; 437/47; 437/60; 437/228
[58] Field of Search .................. 437/29, 44, 40, 41, 437/47, 52, 60, 228, 919; 351/41, 23.6

[56] References Cited

U.S. PATENT DOCUMENTS

| 4,435,896 | 3/1984 | Paullo et al. | 437/47 |
| 4,466,177 | 8/1984 | Chao | 437/47 |
| 4,536,947 | 8/1985 | Bohr et al. | 437/919 |
| 4,758,898 | 6/1988 | Parillo et al. | 437/44 |

Primary Examiner—Brian E. Hearn
Assistant Examiner—T. Thomas
Attorney, Agent, or Firm—Sughrue, Mion, Zinn, Macpeak & Seas

[57] ABSTRACT

A method for fabricating a semiconductor memory device which includes a single substrate, at least one memory cell including at least one MOS transistor formed on the single substrate, and a peripheral circuit having at least one MOS transistor formed on the single substrate, comprises the steps of forming on the single substrate a gate electrode for each of the MOS transistors of the memory cell and the peripheral circuit, iono-implanting impurities at a low dosage by using the gate electrodes as a mask so as to forming a low impurity concentration of source/drain regions of the MOS transistors of the memory cell and the peripheral circuit, depositing a mask layer to cover an area of the memory cell, and ion-implanting impurities at a high dosage by using the mask layer as a mask, so as to dope impurities to only the source/drain regions of the MOS transistor of the peripheral circuit, so that the MOS transistor of the memory cell has the source/drain regions of a low impurity concentration, and the MOS transistor of the peripheral circuit has the source/drain regions including a high impurity concentration portion.

8 Claims, 2 Drawing Sheets

METHOD FOR FABRICATING SEMICONDUCTOR MEMORY DEVICE

BACKGROUND OF THE INVENTION

1. Field of the Invention

The present invention relates to a method for fabricating a MOS type semiconductor memory device, and more specifically to a method for selectively forming a low impurity concentration source/drain region and a high impurity concentration source/drain region in the process of fabricating a MOS type semiconductor memory device including a memory cell zone and a peripheral circuit zone formed in the same substrate. Here, the term "source/drain region" used in this specification should be understood to means a region which acts as a source region or a drain region, or both.

2. Description of Related Art

In conventional MOS type semiconductor memory devices, both of a memory formed of a number of memory cells and a peripheral circuit include MOS transistors having source and drain regions formed by an ion implantation of a high dosage. However, the ion implantation of the high dosage for the formation of source/drain regions has resulted in damage of the device, which deteriorates a junction leakage characteristics, and also has made it difficult to form a shallow junction. These disadvantages will inevitably decrease a reliability of an electric charge hold characteristics of memory cells, with increase of the fineness and the integration density of memory cells, which is a tendency of advancement of technology.

SUMMARY OF THE INVENTION

Accordingly, it is an object of the present invention to provide a method for fabricating a MOS type semiconductor memory device, which has overcome the above mentioned defect of the conventional one.

Another object of the present invention is to provide a method for fabricating a MOS type semiconductor memory device, which method will not deteriorate a junction leakage characteristics, and will make it possible to form a shallow junction.

A further object of the present invention is to provide a method for fabricating a MOS type semiconductor memory device, which method will not decrease a reliability of an electric charge hold characteristics of memory cells, even if the fineness and the integration density of the memory cells are increased.

A still further object of the present invention is to provide a MOS type semiconductor memory device including memory cells having a reliable electric charge hold characteristics.

The above and other objects of the present invention are achieved in accordance with the present invention by a method for fabricating a semiconductor memory device which includes a single substrate, at least one memory cell including at least one MOS transistor formed on the single substrate, and a peripheral circuit having at least one MOS transistor formed on the single substrate, comprising the steps of forming on the single substrate a gate electrode for each of the MOS transistors of the memory cell and the peripheral circuit, ion-implanting impurities at a low dosage by using the gate electrodes as a mask so as to form a low impurity concentration of source/drain regions of the MOS transistors of the memory cell and the peripheral circuit, depositing a mask layer to cover an area of the memory cell, and ion-implanting impurities at a high dosage by using the mask layer as a mask, so as to dope impurities to only the source/drain regions of the MOS transistor of the peripheral circuit, so that the MOS transistor of the memory cell has the source/drain regions of a low impurity concentration, and the MOS transistor of the peripheral circuit has the source/drain regions including a high impurity concentration portion.

Preferably, the ion implantation of the high impurity concentration is performed with a dosage which is not less than $10^2$ times the dosage for the ion implantation of the low impurity concentration. Specifically, the ion implantation of the low impurity concentration is performed by implanting phosphorous or arsenic with a dosage on the order of $10^{13}/cm^2$ at an acceleration energy of 20 to 30 KeV, and the ion implantation of the high impurity concentration is performed by implanting arsenic with a dosage on the order of $10^{15}/cm^2$ at an acceleration energy of 30 to 70 KeV. In addition, before the ion implantation of the high impurity concentration, an oxide layer is formed to cover each side wall of the gate electrode of the MOS transistor of the peripheral circuit, so that the drain/source region of the MOS transistor of the peripheral circuit has a light doped drain structure composed of a low impurity concentration portion and a high impurity concentration portion.

In the conventional semiconductor memory devices, it is considered that the deterioration of the junction leakage characteristics remarkably appears in source/drain regions of transistors in memory cells, if the fineness and the integration density of memory cells are increased. In the above mentioned method in accordance with the present invention, the source/drain regions of the memory cell MOS transistor are formed by ion-implanting impurities at a low dosage, and therefore, the damage due to the ion implantation is made as small as possible, with the result that a junction leakage is decreased. On the other hand, the source/drain regions of the MOS transistor of the peripheral circuit which is required to have a low resistance, are formed by ion-implanting impurities at a high dosage. Therefore, a highly reliable MOS type semiconductor memory device can be obtained which includes a memory cell transistor having a decreased junction leakage and a peripheral circuit transistor having a low source/drain resistance.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
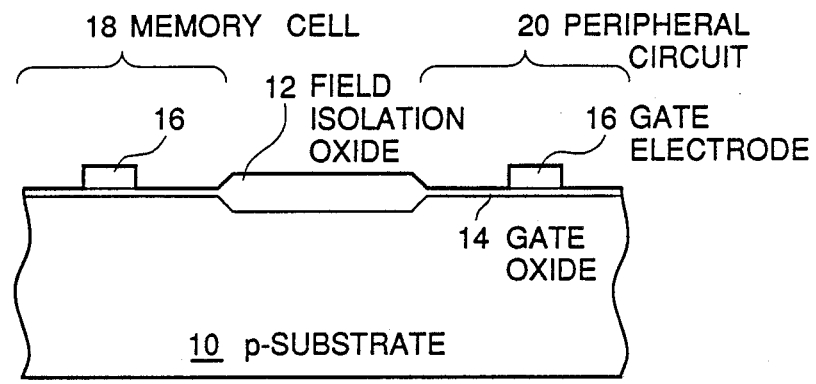
FIGS. 1A to 1C are diagrammatic sectional views of a semiconductor device illustrating some important steps of the method in accordance with the present invention for fabricating the semiconductor memory device.

Referring to FIG. 1A, there is shown a diagrammatic sectional view of a semiconductor device illustrating one important step of the fabricating method in accordance with the present invention. In FIG. 1A, Reference Numeral 10 designates a p-type semiconductor substrate, which has thereon a field isolation oxide 12 and two gate oxide layers 14 separated from each other by the field isolation oxide 12. On each of the gate oxide layers 14, a gate electrode 16 is formed. In addition, a memory cell zone 18 and a peripheral circuit zone 20 are separated from each other by the shown field isolation oxide 12. In the drawing of FIG. 1A, a left side of the field isolation oxide 12 is assigned to the memory cell zone 18, and a right side of the field isolation oxide 12 is assigned to the peripheral circuit zone 20.

Figure 1B:
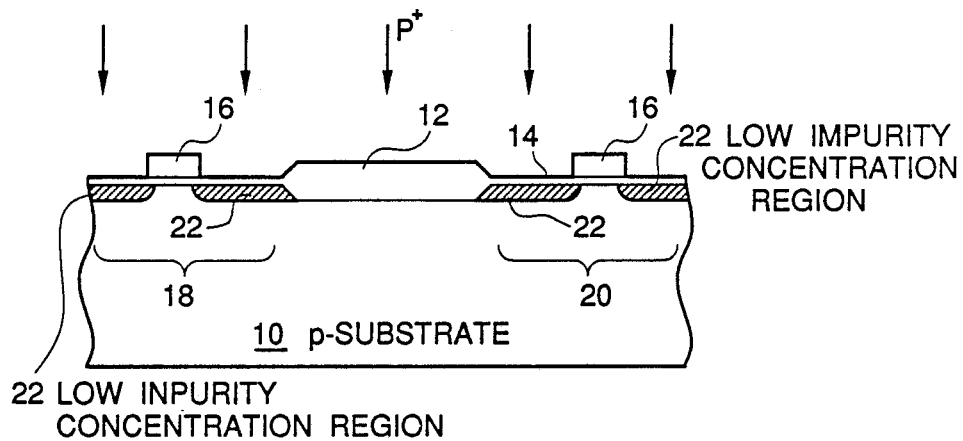

In this condition, impurity such as phosphorous or arsenic, which has a conduction type opposite to that of the substrate 10, is ion-implanted to an overall surface of the substrate including the memory cell zone 18 and the peripheral circuit zone 20, with a low dosage of for example $3 \times 10^{13}/cm^2$ to $5 \times 10^{13}/cm^2$, as shown in FIG. 1B. In this ion-implantation, the gate electrodes 16 function as a mask, so that shallow low impurity concentration regions 22 are formed at each side of the gate electrodes 16.

Thereafter, an aluminum is spattered to cover the overall surface of the substrate 10, and patterned to cover only the memory cell zone 18 and a half of the field isolation oxide 12 adjacent to the memory cell zone 18, by use of a patterned photoresist. As a result, as shown in FIG. 1C, only the memory cell zone 18 and the half of the field isolation oxide 12 adjacent to the memory cell zone 18 are covered by the aluminum layer 24.

Figure 1C:
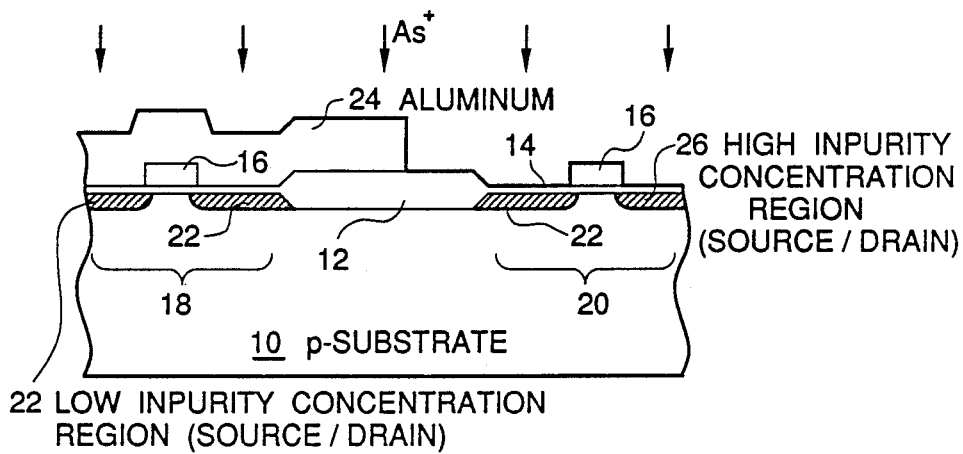

In this condition, impurity such as arsenic, which has a conduction type opposite to that of the substrate 10, is ion-implanted to an overall surface of the substrate including the aluminum layer 24 and the peripheral circuit zone 20, with a high dosage of for example $5 \times 10^{15}/cm^2$, as shown in FIG. 1C. In this doping process, the aluminum layer 24 function as a mask, so that the low impurity concentration regions 22 are maintained at each side of the gate electrode 16 in the memory cell zone 18. On the other hand, the gate electrode 16 in the peripheral circuit zone 20 functions as a mask, so that high impurity concentration regions 26 are formed at each side of the gate electrode 16 in the peripheral circuit zone 20.

As seen from the above, the MOS transistor within the memory cell zone 18 includes a source and a drain composed of a low impurity concentration regions 22, and on the other hand, the MOS transistor within the peripheral circuit zone 20 includes a source and a drain composed of a high impurity concentration regions 24. Accordingly, the MOS type semiconductor memory device thus obtained includes a memory cell transistor having a decreased junction leakage and a peripheral circuit transistor having a low source/drain resistance. In other words, the MOS type semiconductor memory device includes a memory cell having an improved charge holding characteristics and a peripheral circuit transistor having a low source/drain resistance.

In addition, if only opposite side walls of the gate electrode 16 within the peripheral circuit zone 20 is covered by an oxide layer before ion-implantation of arsenic, the MOS transistor formed within the peripheral circuit zone 20 can have a light-doped drain structure in which a low impurity concentration portion is formed in self-alignment with the gate electrode 16 and a high impurity concentration portion is formed in self-alignment with the oxide layer formed on opposite side walls of the gate electrode 16.

Figure 2:
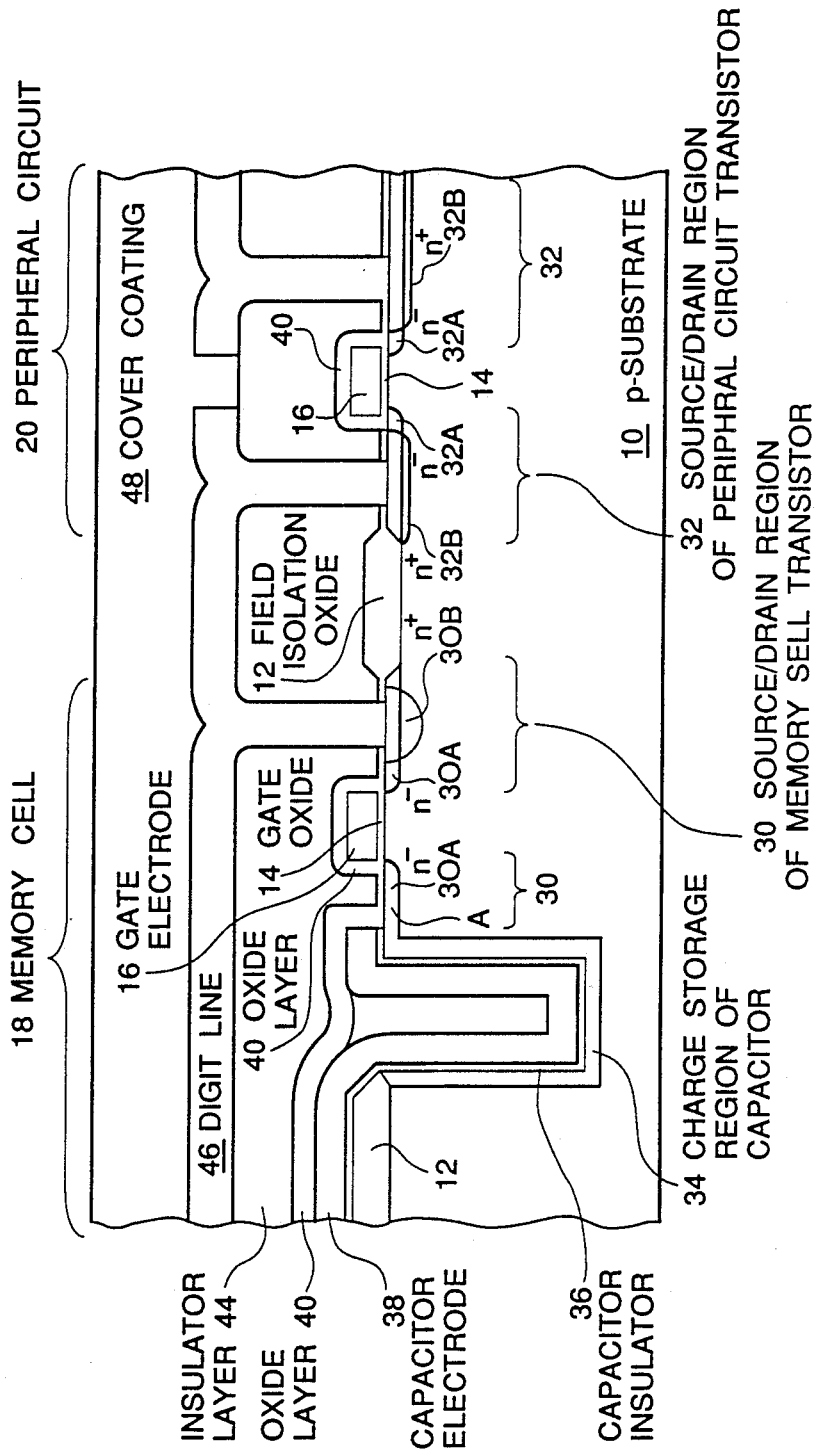
FIG. 2 is a diagrammatic sectional view of the Dynamic read only memory (DRAM) device formed in accordance with the fabricating method of the present invention.

Referring to FIG. 2, there is shown a diagrammatic sectional view of the Dynamic read only memory (DRAM) device formed in accordance with the fabricating method of the present invention. In FIG. 2, elements similar or corresponding to those shown in FIGS. 1A to 1C are given the same Reference Numerals, and therefore, explanation thereof will be omitted for simplification of the description.

A memory cell formed in the memory cell zone 18 is of a one-transistor type, which includes a MOS transistor having a source formed of a source/drain region 30A coupled to a digit line 46, a gate electrode 16 formed on the substrate 10 through a gate oxide 14 and covered by an oxide layer 40, and a drain formed of another source/drain region 30A coupled to a charge storage region 34, which is formed in a vertical trench to extend over an overall inner wall surface of the vertical trench. In the vertical trench, the charge storage region 34 opposes a capacitor electrode 38 with a capacitor insulator 36 being interposed between the charge storage region 34 and the capacitor electrode 38. Thus, a storage capacitor is formed, and a top portion of the storage capacitor is covered by an oxide layer 40. The storage capacitor and the MOS transistor cooperates to form a one-transistor dynamic memory cell.

On the other hand, a MOS transistor in the peripheral circuit zone 20 has a gate electrode 16 formed on the substrate 10 through the gate oxide 14 and covered by the oxide layer 40, and a source and a drain each of which is composed of a lightly doped region 32A formed in self-alignment with a side edge of the gate electrode 16 and a highly doped region 32B formed in self-alignment with a side edge of the oxide layer 40.

A whole of the above mentioned structure is covered by an insulator layer 44, and the digit line 46 is formed to provide a required wiring pattern on the insulator layer 44. In addition, the substrate is over-coated with a cover coating made 48 of insulating material. The digit line 46 connected to the source 30A of the memory cell transistor is connected to one of the two source/drain regions of the transistor within the peripheral circuit zone 20.

In the above mentioned DRAM memory device, the source region and the drain region of the MOS transistor within the memory cell zone 18 are a low impurity concentration region formed by only an ion-implantation of a low dosage, as seen from the explanation made hereinbefore with reference to FIG. 1B. On the other hand, the source region and the drain region of the MOS transistor within the peripheral circuit zone 20 is formed by performing the ion-implantation of the low dosage for forming the source region and the drain region of the MOS transistor of the memory cell zone 18, and thereafter, forming the oxide layer 40 at opposite side walls of the gate electrode 16, and then, performing an ion-implantation of a high dosage, as seen from the explanation made hereinbefore with reference to FIG. 1C. Thus, the light doped drain structure is formed at each side of the gate electrode 16 of the MOS transistor within the peripheral circuit zone. The digit line 46 is connected to the high impurity concentration portion of the light doped drain structure of the MOS transistor of the peripheral circuit zone 20.

On the other hand, when a contact between the digit line 46 and the source/drain region 30A of the MOS transistor within the memory cell zone 18 is formed, an high impurity concentration portion 30B contiguous to the digit line 46 is formed within the source/drain region 30A of the MOS transistor within the memory cell zone 18. Therefore, a light doped drain structure is actually formed in the source/drain region of the MOS transistor of the memory cell zone 18 coupled to the digit line 46.

In the shown embodiment, the low impurity concentration portions 30A and 32A of the source/drain regions are formed by ion-implanting phosphorous to an overall surface of the substrate, with a low dosage of the order of $10^{13}/cm^2$ at a low acceleration energy of 20 to 30 KeV. As a result, damage to a portion "A" of the source/drain region of the memory transistor which interconnects to the charge storage region of the associated capacitor is extremely decreased in comparison with the case in which arsenic is doped by an ion-implantation of a high dosage. Therefore, a junction leakage current is remarkable decreased and the charge holding characteristics is greatly improved.

On the other hand, the high impurity concentration portions 32B of the source/drain regions are formed by ion-implanting arsenic to an overall surface of the substrate, with a high dosage of the order of $10^{15}/cm^2$ at an acceleration energy of 30 to 70 KeV.

The invention has thus been shown and described with reference to the specific embodiments. However, it should be noted that the present invention is in no way limited to the details of the illustrated structures but changes and modifications may be made within the scope of the appended claims.

I claim:

1. A method for fabricating a semiconductor memory device which includes a single substrate, at least one memory cell including at least one MOS transistor formed on said single substrate, and a peripheral circuit having at least one MOS transistor formed on said single substrate, comprising the steps of forming on said single substrate a gate electrode for each of the MOS transistors of said memory cell and said peripheral circuit, ion-implanting impurities at a low dosage by using said gate electrodes as a mask so as to forming a low impurity concentration of source/drain regions of the MOS transistors of said memory cell and said peripheral circuit, depositing a mask layer to cover an area of said memory cell, and ion-implanting impurities at a high dosage by using said mask layer as a mask, so as to dope impurities to only the source/drain regions of the MOS transistor of said peripheral circuit, so that the MOS transistor of said memory cell has the source/drain regions of a low impurity concentration, and the MOS transistor of said peripheral circuit has the source/drain regions including a high impurity concentration portion.

2. A method claimed in claim 1 wherein said ion implantation of the high impurity concentration is performed with a dosage which is not less than $10^2$ times the dosage for said ion implantation of the low impurity concentration.

3. A method claimed in claim 2 wherein said ion implantation of the low impurity concentration is performed by implanting phosphorous or arsenic with a dosage on the order of $10^{13}/cm^2$, and said ion implantation of the high impurity concentration is performed by implanting arsenic with a dosage on the order of $10^{15}/cm^2$.

4. A method claimed in claim 3 wherein said ion implantation of the low impurity concentration is performed at an acceleration energy of 20 to 30 KeV, and said ion implantation of the high impurity concentration is performed at an acceleration energy of 30 to 70 KeV.

5. A method claimed in claim 1 wherein before said ion implantation of the high impurity concentration, an oxide layer is formed on each side wall of said gate electrode of said MOS transistor of said peripheral circuit, so that the drain/source region of said MOS transistor of said peripheral circuit has a light doped drain structure.

6. A method claimed in claim 5 wherein said ion implantation of the high impurity concentration is performed with a dosage which is not less than $10^2$ times the dosage for said ion implantation of the low impurity concentration.

7. A method claimed in claim 6 wherein said ion implantation of the low impurity concentration is performed by implanting phosphorous or arsenic with a dosage on the order of $10^{13}/cm^2$, and said ion implantation of the high impurity concentration is performed by implanting arsenic with a dosage on the order of $10^{15}/cm^2$.

8. A method claimed in claim 7 wherein said ion implantation of the low impurity concentration is performed at an acceleration energy of 20 to 30 KeV, and said ion implantation of the high impurity concentration is performed at an acceleration energy of 30 to 70 KeV.

* * * * *

UNITED STATES PATENT AND TRADEMARK OFFICE
CERTIFICATE OF CORRECTION

PATENT NO.   : 4,977,099
DATED        : December 11, 1990
INVENTOR(S)  : Hiroshi KOTAKI It is certified that error appears in the above-identified patent and that said Letters Patent is hereby corrected as shown below:

TITLE PAGE:

IN THE ABSTRACT:

Line 8, delete "iono-", and insert --ion--;

Line 10, delete "forming", and insert --form--;

Column 1, line 16, delete "means", and insert --mean--.

Signed and Sealed this

Twenty-second Day of September, 1992

Attest:

DOUGLAS B. COMER

*Attesting Officer*           *Acting Commissioner of Patents and Trademarks*